(12) United States Patent
Suzuki et al.

(10) Patent No.: US 10,451,971 B2
(45) Date of Patent: Oct. 22, 2019

(54) COMPOSITION FOR FORMING UNDERLAYER AND METHOD FOR FORMING UNDERLAYER THEREWITH

(71) Applicant: AZ Electronic Materials (Luxembourg) S.a.r.l., Luxembourg (LU)

(72) Inventors: Masato Suzuki, Kakegawa (JP); Yusuke Hama, Kakegawa (JP); Hiroshi Yanagita, Kakegawa (JP); Go Noya, Kakegawa (JP); Shigemasa Nakasugi, Kakegawa (JP)

(73) Assignee: AZ Electronic Materials (Luxembourg) S.a.r.l., Luxembourg (LU)

( * ) Notice: Subject to any disclaimer, the term of this patent is extended or adjusted under 35 U.S.C. 154(b) by 0 days.

(21) Appl. No.: 15/550,490

(22) PCT Filed: Feb. 2, 2016

(86) PCT No.: PCT/EP2016/000166
§ 371 (c)(1),
(2) Date: Aug. 11, 2017

(87) PCT Pub. No.: WO2016/128117
PCT Pub. Date: Aug. 18, 2016

(65) Prior Publication Data
US 2018/0039178 A1    Feb. 8, 2018

(30) Foreign Application Priority Data

Feb. 12, 2015  (JP) ................. 2015-025574

(51) Int. Cl.
| G03F 7/11 | (2006.01) |
| C09D 177/10 | (2006.01) |
| C09D 179/02 | (2006.01) |
| C08G 73/02 | (2006.01) |
| G03F 7/09 | (2006.01) |
| G03F 7/16 | (2006.01) |
| G03F 7/20 | (2006.01) |
| G03F 7/30 | (2006.01) |

(52) U.S. Cl.
CPC .............. *G03F 7/11* (2013.01); *C08G 73/026* (2013.01); *C09D 177/10* (2013.01); *C09D 179/02* (2013.01); *G03F 7/094* (2013.01); *G03F 7/16* (2013.01); *G03F 7/168* (2013.01); *G03F 7/2006* (2013.01); *G03F 7/30* (2013.01)

(58) Field of Classification Search
CPC .......... G03F 7/11; G03F 7/094; C08G 73/026
USPC ....................................... 430/271.1
See application file for complete search history.

(56) References Cited

U.S. PATENT DOCUMENTS

| 5,120,472 A | 6/1992 | Shikatani et al. |
| 7,226,721 B2 | 6/2007 | Takei et al. |
| 2008/0070154 A1* | 3/2008 | Taguchi .................... B41C 1/05 430/270.1 |
| 2008/0081720 A1 | 4/2008 | Oishi et al. |
| 2009/0043040 A1 | 2/2009 | Botros et al. |
| 2014/0220353 A1* | 8/2014 | Kodama ................. G03F 7/094 428/411.1 |
| 2014/0235059 A1 | 8/2014 | Sakamoto et al. |
| 2015/0199873 A1 | 7/2015 | Capps |
| 2017/0210896 A1 | 7/2017 | Nakasugi et al. |

FOREIGN PATENT DOCUMENTS

| EP | 0194470 A2 | 9/1986 |
| EP | 2636697 A1 | 9/2013 |
| EP | 2789668 A1 | 10/2014 |
| JP | 2008081720 A | 4/2008 |
| JP | 2008242492 A | 10/2008 |
| WO | WO-2013/047516 A1 * | 4/2013 |
| WO | WO-2015182581 A1 | 12/2015 |

OTHER PUBLICATIONS

"Aliphatic compounds", PAC, 1995, 67, 1307 (Glossary of class names of organic compounds and reactivity intermediates based on structure (IUPAC Recommendations 1995)) on p. 1313.*
1,4-dioxane, CAS registry No. 123-91-1, from SciFinder database, American Chemical Society, down loaded Jan. 2019, 31 pages. (Year: 2019).*
International Search Report for PCT/EP2016/000166 dated Apr. 19, 2616.
Written Opinion of the International Searching Authority for PCT/EP2016/000166 dated Apr. 19, 2016.

* cited by examiner

*Primary Examiner* — Cynthia Hamilton
(74) *Attorney, Agent, or Firm* — Drinker Biddle & Reath LLP

(57) ABSTRACT

[Problem] To provide a composition for an underlayer, which can form an underlayer having flattened surface.
[Means for Solution] A composition for forming an underlayer, comprising a polymer having a repeating unit containing nitrogen and a solvent. An underlayer is formed by coating this composition on a substrate, preferably baking in an inert atmosphere, and then baking in the air containing oxygen.

14 Claims, No Drawings

COMPOSITION FOR FORMING UNDERLAYER AND METHOD FOR FORMING UNDERLAYER THEREWITH

CROSS-REFERENCE TO RELATED APPLICATIONS

This application is a national stage application (under 35 U.S.C. § 371) of PCT/EP2016/000166, filed Feb. 2, 2016, which claims benefit of Japanese Application No. 2015-025574, filed Feb. 12, 2015, both of which are incorporated herein by reference in their entirety.

BACKGROUND OF THE INVENTION

Technical Field

The present invention relates to a composition for forming an underlayer and a method for forming an underlayer therewith when a pattern is made using a photoresist by the photolithography method.

Background Art

In manufacturing semiconductor devices, micro-processing by lithography using photoresist has been carried out. The micro-processing is a processing method comprising forming a thin layer of a photoresist on a semiconductor substrate such as silicon wafer or the like, irradiating actinic rays such as UV-rays through a mask pattern on which a pattern for a semiconductor device is depicted, developing it to obtain a photoresist pattern, and etching the substrate using the photoresist pattern as a protective layer, thereby forming fine concavo-convex structure corresponding to the pattern on the surface of the substrate.

In micro-processing, flat surface substrates are generally used as semiconductor substrate. When forming a photoresist pattern on a surface of a substrate, if the surface of the substrate has low flatness, reflected light from the surface of the substrate is irregularly refracted and it becomes difficult to form patterns with high accuracy.

On the other hand, there are cases requiring formation of a concavo-convex structure on a surface of a substrate. Specifically, a pattern is formed by forming a substrate having a concavo-convex structure on the surface of the substrate using photolithography and the like, further forming a coating layer comprising for example silica on the surface, and further processing the layer by photolithography. In this case, when forming a layer directly on a surface of a substrate having a concavo-convex structure, the concavo-convex structure on the surface of the substrate causes non-uniformity in the coating thickness and the final obtained pattern with low accuracy.

To cope with these problems, when using a surface of a substrate having a concavo-convex structure, process comprising coating a composition containing an organic polymer on a surface of a substrate and filling the organic polymer in the concave part of the substrate to form a flattening surface has been studied. This layer which fills the concave part of the substrate to flatten the surface is called an organic flattening layer (Patent document 1).

However, when an organic flattening layer is formed with conventionally known various compositions, it is difficult to avoid completely an influence of the substrate having a concavo-convex structure and to achieve enough flatness of a surface of an organic flattening layer. Specifically, in some cases, there is at most several 10 nm of difference in height.

It is also considered to flatten the surface of the organic flattening layer formed above by processing the surface in order to improve the uniformity. However, it is difficult to flatten the surface using conventionally known compositions.

PRIOR ART DOCUMENTS

Patent Documents

[Patent document 1] Japanese patent Laid-Open No. 2008-242492

SUMMARY OF THE INVENTION

Problems to be Solved by the Invention

The present invention is made in consideration of such situations, and provides a composition for an underlayer to form an organic flattening layer having little difference in height and enough flatness of a surface, even if a substrate has a concavo-convex structure.

Means for Solving the Problems

The composition for forming an underlayer of the present invention comprises:
a polymer having a repeating unit selected from the following formulae (1) to (4):

wherein
$A^1$, $A^2$, $A^{2'}$, $A^3$ and $A^4$ are independently aromatic group, saturated or unsaturated aliphatic hydrocarbon group, where said aromatic group or aliphatic hydrocarbon group may be substituted by a substituent selected from the group consisting of hydroxy group, alkyl group, aryl group, alkoxy group, nitro group, amide group, dialkylamino group, sulfonamide group, imide group, carboxy group, sulfonic acid ester group, alkylamino group and arylamino group,
$L^1$, $L^2$, $L^3$ and $L^{3'}$ are independently selected from the following formulae (a1) to (a3):

wherein
$Z^1$ is selected from the group consisting of hydrogen, aliphatic group and aromatic group,
said aliphatic group or aromatic group is selected from the group consisting of alkyl group, aryl group, alkoxy group, nitro group, amide group, dialkylamino group, sulfonamide group, imide group, carboxy group, sulfonic acid ester group, alkylamino group and arylamino group,
$Z^2$ is selected from the group consisting of hydrogen, hydroxy group, aliphatic group, and aromatic group,
said aliphatic group or aromatic group is selected from the group consisting of alkyl group, aryl group, alkoxy group, nitro group, amide group, dialkylamino group, sulfonamide group, imide group, carboxy group, sulfonic acid ester group, alkylamino group and arylamino group,
$L^4$ is selected from the group consisting of amino group and carbamoyl group, and substituted aromatic group and substituted aliphatic group having the amino group and carbamoyl group as substituent, and
a solvent.

Further, the underlayer of the present invention is obtained by coating a substrate with said composition for forming an underlayer, pre-baking in an inert gas atmosphere and further baking in the presence of oxygen.

Further, the present invention is a pattern formation method, comprising:
a coating step, wherein a coating layer is formed by coating a substrate with said composition for forming an underlayer, pre-baking in an inert gas atmosphere and further baking in the presence of oxygen,
a resist layer forming step, wherein a photoresist layer is formed on said underlayer,
an exposure step, wherein said substrate coated with said underlayer and said photoresist layer is exposed, and
a developing step, wherein the exposed substrate is developed with a developing solution.

Effects of the Invention

The present invention provides a composition for an underlayer, which has excellent coating properties and can form an underlayer, generating little void inside it, and excellent heat resistance and solvent resistance. Further, this composition can achieve high flatness, specifically height difference on a surface of an underlayer is 10 nm or less, and high surface smoothness, even if it forms an underlayer on a substrate having a concavo-convex structure. Further, a forming method of the present invention can be combined with flattening treatment by solvent etched back, and thus can achieve higher flatness formed surface.

DETAILED DESCRIPTION OF THE INVENTION

Mode for Carrying Out the Invention

Embodiments of the present invention are described below in detail.
<Composition for Forming an Underlayer>
The composition for forming an underlayer of the present invention comprises a polymer having a certain chemical structure and a solvent. The polymer has a repeating unit selected from the following formulae (1) to (4). When one of these polymers is used for a composition for an underlayer, there are few voids generated in the process of forming an underlayer and highly flat underlayer can be achieved because treatment at higher temperature can be performed by high heat resistance of the underlayer. Although it is not clear to what makes such excellent effects, it is assumed that these polymers contain a nitrogen atom having sp$^3$ orbital and a carbon atom having sp$^2$ orbital adjacently in the structure and it results in high heat resistance. A repeating unit represented by formulae (1) to (3) contains a nitrogen atom at the main chain and a repeating unit represented by formula (4) contains a nitrogen atoms at the side chain.

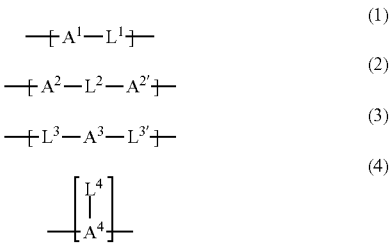

wherein
$L^1$, $L^2$, $L^3$, $L^{3'}$ and $L^4$ are a group containing a nitrogen atom having lone electron pair,
$A^1$, $A^2$, $A^{2'}$, $A^3$ and $A^4$ are a linking group.
Specifics of these groups are described below in detail.
$A^1$, $A^2$, $A^{2'}$, $A^3$ and $A^4$ are independently aromatic group, saturated or unsaturated aliphatic hydrocarbon group. The aliphatic hydrocarbon group may be linear, branched or cyclic. Said aromatic group or aliphatic hydrocarbon group may be substituted by a substituent selected from the group consisting of hydroxy group, alkyl group, aryl group, alkoxy group, nitro group, amide group, dialkylamino group, sulfonamide group, imide group, carboxy group, sulfonic acid ester group, alkylamino group and arylamino group. Here, the size of these groups is not limited, but if the size is excessively-large, the ratio of nitrogen atoms becomes small and it can result in low heat resistance. Therefore, the carbon number contained in $A^1$, $A^2$, $A^{2'}$, $A^3$ and $A^4$ is preferably 1 to 12.
Preferably, $L^1$, $L^2$, $L^3$ and $L^{3'}$ are independently selected from the following formulae (a1) to (a3):

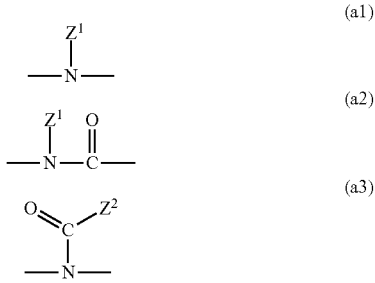

wherein
$Z^1$ is selected from the group consisting of hydrogen, aliphatic group and aromatic group,
said aliphatic group or aromatic group is selected from the group consisting of alkyl group, aryl group, alkoxy group, nitro group, amide group, dialkylamino group, sulfonamide group, imide group, carboxy group, sulfonic acid ester group, alkylamino group and arylamino group,
$Z^2$ is selected from the group consisting of hydrogen, hydroxy group, aliphatic group and aromatic group, said aliphatic group or aromatic group is selected from the group consisting of alkyl group, aryl group, alkoxy group, nitro group, amide group, dialkylamino group, sulfonamide group, imide group, carboxy group, sulfonic acid ester group, alkylamino group and arylamino group.

Preferably, the carbon number contained in $Z^1$ or $Z^2$ is 6 or less in terms of heat resistance.

Preferably, $L^4$ is selected from the group consisting of amino group (—$NH_2$), carbamoyl group (—(C=O)—$NH_2$), and substituted aromatic group and substituted aliphatic group having the amino group and carbamoyl group as substituent. Thus, other than $A^4$ group is directly bound to amino group or carbamoyl group, for example $A^4$ group may be bound to aliphatic group of 1 to 12 carbon atoms or aromatic group of 6 to 12 carbon atoms, and these aliphatic group or aromatic group may be bound to amino group or carbamoyl group. Here, hydrogen of amino group or carbamoyl group may be substituted by such as aliphatic group or aromatic group.

Polymers containing such repeating units can have various types of structure. Examples of the structure are as follows.

For example, said $A^1$, $A^2$ and $A^{2'}$, are independently polymers selected from the groups of phenylene group and naphthylene group, said $Z^1$ is a polymer selected from the groups of hydrogen, phenyl group and naphthyl group. Those polymers contain aromatic group at the main chain and have excellent heat resistance and thermal stability at about 400° C., and are handled easily used in a composition for an underlayer.

Further, said $A^1$, $A^2$ and $A^{2'}$, are independently selected from the group of alkylene group of 1 to 6 carbon numbers and alkenylene group of 2 to 6 carbon numbers, said $Z^1$ and $Z^2$ are polymers independently selected from the group of hydrogen, alkyl group of 1 to 10 carbon numbers, cycloalkyl group of 3 to 10 carbon numbers, alkenyl group of 2 to 10 carbon numbers, cycloalkenyl group of 3 to 10 carbon numbers, aryl group of 6 to 10 carbon numbers and cyclic amine group of 2 to 5 carbon numbers. Such polymers contain aromatic group at the main chain and are preferably easy to be decomposed and evaporated at a specific temperature in a short time used in a composition for forming an underlayer.

Further, as said $A^4$, selected from the group of saturated hydrocarbon group of 1 to 6 carbon atoms and unsaturated hydrocarbon group of 2 to 6 carbon atoms, said as $L^4$, a polymer selected from the group of substituted or unsubstituted amino group, substituted or unsubstituted carbamoyl group and hydrocarbon group substituted with them are preferably used.

Further, as said $A^3$, selected from the group of saturated hydrocarbon group of 1 to 12 carbon atoms and unsaturated hydrocarbon group of 2 to 12 carbon atoms, as said $L^3$, a polymer selected from the group of —(NH)— and (NH)—(C=O)— are preferably used.

The polymer of the present invention contains said repeated unit and may contain two or more said repeated units unless it impairs the effect of the present invention. In such cases, the polymer may contain repeated units randomly and each repeated unit block. Further, two or more repeated units may arranged regularly. For example, a polymer in which two repeated units are regularly and alternately bonded is obtained by reacting a monomer having two amino groups at its end (correspond to said formula (3)) with a monomer having two carboxy groups. This polymer can also be used suitably for the present invention. Preferably, the polymer has preferably 40 mol % or more, more preferably 75 mol % or more, said repeated unit represented by formulae (1) to (3), based on the total number of repeated units.

The molecular weight of the polymer used for the present invention can be freely adjusted according to a purpose. The mass-average molecular weight Mw is preferably 1,000 to 1,000,000, more preferably 3,000 to 500,000. Here, in the present invention, the mass-average molecular weight means for the mass-average molecular weight in terms of polystyrene. Further, the molecular weight distribution is preferably small from the view point of permeability at coating a composition and coating uniformity.

The composition for forming an underlayer of the present invention comprises a solvent. Such a solvent can be freely selected as long as it can dissolve said polymer. The examples of these solvents include ethyleneglycol monomethyl ether, ethyleneglycol monoethyl ether, methyl cellosolve acetate, ethyl cellosolve acetate, diethyleneglycol monomethyl ether, diethyleneglycol monoethyl ether, propylene glycol, propyleneglycol monomethyl ether (can be called PGME hereinafter), propyleneglycol monomethyl ether acetate (can be called PGMEA hereinafter), propylene glycol propyl ether acetate, toluene, methoxy toluene, anisole, xylene, chlorobenzene, dichlorobenzene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methyl butyrate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylfolmamide, N,N-dimethylacetamide, n-methyl pyrrolidone and acetonitrile. These solvents can be used in one or combination of two or more. Further, a high boiling point solvent such as propylene glycol monobutyl ether, propylene glycol monobutyl etheracetate can be mixed.

The composition for forming an underlayer of the present invention can comprise other components, if necessary. Examples of these components include a cross-linking agent, an acid generator, a surfactant and a leveler compound. These components should be used unless it impairs the effect of the present invention.

The composition of the present invention can comprise a cross-linking agent. The cross-linking agent can be used to prevent a forming underlayer from mixing with the upper layer. Examples of these cross-linking agents include hexamethylmelamine, hexxamethoxymethylmelamine, 1,2-dihydroxy-N,N'-methoxymethylsuccinimide, 1,2-dimethoxy-N,N'-methoxymethylsuccinimide, 1,3,4,6-tetrakis (methoxymethyl)glycoluril, 4,5-dimethoxy-1,3-bis (methoxyethyl)imidazolidine-2-on, 1,1,3,3,-tetramethoxyurea, tetramethoxymethylglycoluril and N,N'-methoxymethylurea.

The composition of the present invention can comprise an acid generator. The acid generator can be used to accelerate the crosslinking of the forming underlayer.

The acid generator is largely classified into a thermal acid generator and a photo acid generator. These acid generators can be selected among conventionally known one.

The examples of thermal acid generators which can be used for the composition for forming the underlayer of the present invention include salt and ester which can generate organic acid such as various kinds of aliphatic sulfonic and a salt thereof, various kinds of aliphatic carboxylic acid such as citric acid, acetic acid and maleic acid and a salt thereof, various kinds of aromatic carboxylic acid such as benzoic acid and phthalic acid and a salt thereof, aromatic sulfonic acid and a ammonium salt thereof, various kinds of amine salt, aromatic diazonium salt, and phosphonic acid and a salt thereof. Among thermal acid generator used in the present invention, a salt consist of organic acid and organic base is preferable and a salt consist of sulfonic acid and organic base is more preferable.

The examples of preferable thermal acid generators containing sulfonic acid include p-toluenesulfonic acid, benzene sulfonic acid, p-dodecylbenzenesulfonic acid, 1,4-naphthalenedisulfonic acid and methanesulfonic acid. These acid generators can also be used in combination of two or more.

The examples of the photo acid generator which can be used for the composition of the present invention include onium salt compounds, crosslinkable onium salt compounds, sulfone maleimide derivatives and disulfonyl diazomethane compounds.

The examples of the onium salt compounds include iodnium salt compounds such as diphenyl iodonium hexafluorophosphate, diphenyl iodonium trifluoromethane sulfonate, diphenyl iodonium nonafluoro-noramlbutane sulfonate, diphenyl iodonium perfluoro-normaloctane sulfonate, diphenyl iodonium camphor sulfonate, bis(4-tert-butylphenyl)iodnium camphor sulfonate and bis(4-tert-butylphenyl)iodnium trifluoromethane sulfonate, sulfonium salt compounds such as triphenylsulfonium hexafluoroantimonate, triphenylsulfonium nonafluoro-noramlbutane sulfonate, triphenylsulfonium camphor sulfonate and triphenylsulfonium trifluoromethane sulfonate, and crosslinkable onium salt compounds such as bis(4-hydroxyphenyl)(phenyl)sulfonium trifluoromethane sulfonate, bis(4-hydroxyphenyl)(phenyl)sulfonium-1,1,2,2,3,3,4,4,4-nonafluorobutane-1-sulfonate, phenyl bis(4-(2-(vynyloxy)ethoxy)phenyl)sulfonium-1,1,2,2,3,3,4,4-octafluorobutane-1,4-disulfonate, tris(4-(2-(vynyloxy)ethoxy)phenyl)sulfonium-1,1,2,2,3,3,4,4-octafluorobutane-1,4-disulfonate, but not limited to them.

The examples of the sulfone maleimide derivative include N-(trifluoromethane sulfonyloxy)succinimide, N-(nonafluoro-noramlbutane sulfonyloxy)succinimide, N-(camphor sulfonyloxy)succinimide and N-(trifluoromethane sulfonyloxy)naphtalimide.

The examples of the disulfonyl diazomethane compounds include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane and methylsulfonyl-p-toluenesulfonyldiazomethane. In the composition for forming an underlayer of the present invention, these photo acid generators can also be used in combination of two or more.

The composition for forming an underlayer of the present invention is provided by mixing said components and dissolving them uniformly. The blended ratio of each component is not limited but properly adjusted according to a purpose.

The content ratio of said polymer in the composition is preferably 0.2 to 20 mass %, more preferably 1 to 10 mass %, further preferably 1 to 3 mass %, based on the total mass of the composition.

Further, when the composition of the present invention comprises the cross-linking agent, the content ratio of the cross-linking agent is preferably 5 to 40 parts mass, more preferably 10 to 30 parts mass based on 100 parts mass of the total of the polymer.

Further, when the composition of the present invention comprises an acid generator, the content ratio of the acid generator is preferably 0.01 to 20 parts mass, more preferably 0.02 to 5 parts mass, based on 100 parts mass of polymer. The shape of photoresist can be controlled by adding the acid generator. It is not completely explained but it is assumed that acidity of the underlayer is controlled by adding the acid generator. In other words, more suitable rectangular shape of photoresist patterns can be formed by adding the acid generator.

The composition for an underlayer obtained from mixing each component is preferably used after filtrated through filter with pore diameter of about 0.2 to 0.05 μm. The composition for an underlayer prepared thus is excellent in storage stability at a room temperature for a long time.

<Method for Forming an Underlayer and Pattern Formation Method>

The method for forming underlayer and pattern formation method of the present invention is as follows.

The composition for forming an underlayer of the present invention is coated on a semiconductor substrate, such as a silicon/silicon dioxide substrate, a silicon nitride substrate, a silicon wafer substrate, a glass substrate and ITO substrate, by an appropriate coating method such as a spinner and a coater. Here, a substrate having a conocavo-convex structure formed on a surface can be used.

According to necessity, the coated layer on the substrate can be dried to remove part of the solvent contained in the coated layer. The drying treatment is carried out at a low temperature, preferably below 200° C., to remove the solvent. During the drying treatment, practical cross-linking reaction does not proceed in the coated layer.

Then, the coated layer is pre-baked in an inert atmosphere, if necessary. This coated layer after pre-baked can be called pre-baked layer for convenience. This pre-baking process further improves flatness of the formed coated layer. It is considered that the flatness is improved by softening of the coated layer without preventing polymers cross-linking each other because of the low content ratio of oxygen in the atmosphere even if heated. Such pre-baking is carried out by heating in an inert atmosphere. Heating temperature is generally 200 to 800° C., preferably 300 to 600° C., and the pre-baking time is generally 0.3 to 120 minutes, preferably 1 to 60 minutes. The content ratio of oxygen is preferably low, preferably 3 mol % or less.

In the coated layer after pre-baking, polymers are unreacted as mentioned above. Thus, the surface layer of the coated layer can be dissolved and removed by bringing the surface of the coated layer into contact with a solvent which can dissolve the polymers. This process is called solvent etched back. As a hardened coated layer by cross-linking cannot be solved and removed by a solvent using the conventional forming method of an underlayer, solvent etched back cannot be combined with the method. According to the present invention, further flatness of the surface can be achieved by applying solvent etched back to the coated layer before cross-linking reaction. In the present invention, this solvent etched back process is called a surface layer removing step.

The processing condition of this surface layer removing step are not limited and kinds of solvent, method for contacting the surface of the coated layer with the solvent, and contacting time can be selected arbitrarily as needed. However, the solvent is generally selected same solvent as used in the composition for an underlayer. The contacting method is preferably dipping the coated layer into the solvent because this method is simple. The contacting time is generally 1 to 10 minutes, preferably 1 to 5 minutes.

The maximum thickness of the coated layer can be reduced to, for example about ⅓ by this surface layer removing step. Here, the maximum thickness of the coated layer means the maximum length from the surface of the substrate to the surface of the coated layer. When the substrate has a concavo-convex structure, it means the distance from the bottom of the concave part to the surface of the coated layer. Generally, the surface layer is removed not to expose the surface of the substrate from the coated layer. Specifically, when there are grooves of 100 nm depth formed and coated layer of maximum thickness of 300 nm on it, removed surface layer is generally less than 200 nm.

Then, the underlayer is formed by further baking the coated layer in the existence of oxygen. Regarding the baking condition, the baking temperature is generally 200 to 800° C., preferably 300 to 600° C., baking time is generally 0.3 to 120 minutes, preferably 1 to 60 minutes. When pre-baking is carried out before baking, the baking time can be reduced. The content of oxygen in the atmosphere is preferably 10 mol % or more. This baking promotes the cross-linking reaction in the underlayer to form the underlayer. The underlayer formed in this way contains, as a main component, an organic substance and it can be called an organic flattening layer.

In this underlayer formation, a substrate having a concavo-convex structure on a surface can be used as a substrate. The concavo-convex structure on the surface of the substrate may be formed in an optional manner, for example photolithography. The formed shape of the concave part can be arbitrary shape such as hole and groove. The cross sectional shape of the concave part is also arbitrary and can be square, trapezoid or semicircular. When the substrate having concave part on the surface of the substrate, typically groove-like concave part, of which cross sectional shape is square, is formed. In this case, the width of the groove is generally 1 to 1,000 nm, preferably 40 to 60 nm, the depth of the groove is generally 20 to 1,000 nm, preferably 80 to 300 nm. Various width and depth of the groove may be mixed. On the other hand, the substrate can have columnar or wall-like convex part, for example fin. Then, when the composition for forming an underlayer of the present invention is applied to a substrate having different size of concave parts and convex parts, higher flatness underlayer can be formed than the underlayer formed by using conventional composition. Though difference in height on the surface of the substrate was generally several ten nm in the conventional underlayer formation method, the flatness is improved by underlayer formation method of the present invention using the same substrate. Especially, difference in height is reduced to 10 nm or less if mixed with the pre-baking step, and it can be reduced to 5 nm or less if further mixed with the surface layer removing step. Here, "difference in height" means the difference between the height of the vertex of highest convex part (highest point) and the height of the bottom of lowest concave part (lowest point). This difference in height can be measured by, for example, an optical interference type film thickness measuring apparatus or an electron scanning microscope. Specifically, film thicknesses of randomly selected points are measured by an electron scanning microscope, and the difference between the thickest point and the thinnest point among them can be regarded as the difference in height.

For example a positive type photoresist composition is coated on the underlayer formed in this way. Here, the positive type photoresist reacts by light irradiation and has solubility with respect to developing solution increased by the reaction. Photoresist used for the present invention is limited but include positive-type photoresist which has photosensitivity with the light for patterning, negative-type photoresist, and negative-tone-development (NTD) photoresist.

Then, the photoresist layer is subjected to exposure through predetermined mask. The wavelength used for the exposure is not limited, but wavelength 13.5 to 248 nm is preferable for the exposure. Specifically, a KrF excimer laser (wavelength 248 nm), an ArF excimer laser (wavelength 193 nm) and an extreme ultraviolet light (wavelength 13.5 nm) can be used and an ArF excimer laser is preferably used.

After the exposure, post exposure bake (PEB) can be carried out, if necessary. The temperature of post exposure bake is generally 80° C. to 150° C., preferably 100° C. to 140° C., and baking time is generally 0.3 to 5 minutes, preferably 0.5 to 2 minutes.

Then, development carried out with a developing solution. By the development, exposure d positive type photoresist layer is removed to form a resist pattern.

The examples of the developing solution used for above pattern formation method include alkaline aqueous solution which include aqueous solution of alkali metal hydroxide such as potassium hydroxide and sodium hydroxide, aqueous solution of quaternary ammonium hydroxide such as tetramethylammonium hydroxide, tetraethylammonium hydroxide, choline and amine aqueous solution such as ethanolamine, propylamine, ethylenediamine. Particularly, 2.38 wt % TMAH aqueous solution can be used. Underlayer can be dissolved and removed easily by using such developing solution at room temperature. Further, the developing solution can be added for example a surfactant.

The temperature of the developing solution is generally 5° C. to 50° C., preferably 20 to 40° C., and developing time is generally 10 to 300 seconds, preferably 30 to 60 seconds.

The present invention is further explained using the following examples, but embodiments of the present invention are not restricted to these examples.

Polymer Synthetic Example 1

Synthesis of poly-4-methyltriphenyleneamine (Polymer P1)

Iron (III) chloride (anhydride) (519 parts) and chloroform (4,330 parts) were introduced in a reactor equipped with a stirrer, a condenser, a heater, a nitrogen introducing pipe and a temperature controller, in an nitrogen atmosphere and the reaction temperature was held at 50° C. Then, 4-methyltriphenylamine (212 parts) dissolved in chloroform (440 parts) was added in it and it was stirred. Then, the reaction temperature was held at 50° C. and reacted for 0.5 hour (oxidative-coupling polymerization).

After the completion of the reaction, the reaction solution was added to acetone (54,000 parts) and particles were filtered. The particles were dissolved in chloroform (4,000 parts), the insoluble part is removed by filtration and 1 mass % aqueous ammonia solution (4,000 parts) was added to the filtrate to extract chloroform solution. Further, the chloroform solution was concentrated, the solution was added to acetone (54,000 parts) and the particles were filtered and vacuum-dried at 90° C. Thus, 85 parts (yield: 40%) of polymer P1 was obtained. Measured by GPC (tetrahydrofuran), number average molecular weight Mn=2,170 Da, mass-average molecular weight Mw=3,991 Da, molecular weight distribution (Mw/Mn)=1.84.

Polymer Synthetic Example 2

Synthesis of Poly-methyldiphenyleneamine (Polymer P2)

Except for changing the monomer from 4-methyltriphenylamine to methyldiphenylamine, the reaction was carried out as in synthetic example 1.

P1

P2

[Preparation of Composition]

The kind and amount of polymer and solvent were shown in Table 1 to obtain compositions a to h and A to H for an underlayer.

TABLE 1

| Polymer | Solvent | Polymer Concentration | |
|---|---|---|---|
| | | 3 wt % | 6 wt % |
| P1 | cyclohexanone | Composition a | Composition A |
| P1 | methoxytoluene | Composition b | Composition B |
| P2 | cyclohexanone | Composition c | Composition C |
| P2 | methoxytoluene | Composition d | Composition D |
| PS | PGMEA | Composition e | Composition E |
| PMMA | PGMEA | Composition f | Composition F |
| PA | cyclohexanone | Composition g | Composition G |
| PE | cyclohexanone | Composition h | Composition H | in the Table,

PS: polystyrene, mass-average molecular weight 10,000 to 100,000

PMMA: polymethylmethacrylate, mass-average molecular weight 10,000 to 100,000

PA: polyamide, mass-average molecular weight 1,000 to 10,000

PE: polyester, mass-average molecular weight 1,000 to 10,000

PS

PMMA

PA

PE

Examples 101 to 104 and Comparative Examples 101 to 104

Underlayers were obtained by coating prepared composition a to h on a flat 4 inch silicon wafer at 1500 rpm using MS-150Atype Spin Coater (trade name, Mikasa Co., Ltd.), heating and drying at 150° C. for 1 minute, and then baking at 250° C. for 2 minutes in the air. The film thickness of obtained underlayers was 100 nm. Coating properties, outgas and heat resistance were evaluated about the obtained underlayers under the following conditions. All examples had sufficient characteristic about coating properties and outgas. About heat resistance, the results of the evaluation were shown in table 2. The evaluation criteria of heat resistance are shown below.
(Evaluation of Heat Resistance)
It was evaluated by differential thermal analysis equipment.
(Evaluation Criteria of Heat Resistance)
A: heat resistance 400° C. or more
B: heat resistance less than 400° C.
(Evaluation of Coating Properties)
Formed underlayer was observed by Lambda Ace VM-3110 optical interference type film thickness measuring apparatus (trade name, Dainippon Screen).
(Evaluation of Outgas)
Outgas was measured at 580° C. using thermal desorption gas photoionization mass spectrometer TRD type R (Rigaku Corporation).

TABLE 2

| | Composition | Heat Resistance | Outgas |
|---|---|---|---|
| Example 101 | a | A | undetected |
| Example 102 | b | A | undetected |
| Example 103 | c | A | undetected |
| Example 104 | d | A | undetected |
| Comparative Example 101 | e | A | detected |
| Comparative Example 102 | f | B | detected |
| Comparative Example 103 | g | B | detected |
| Comparative Example 104 | h | B | detected |

Examples 201 to 204 and Comparative Examples 201 to 204

Underlayers were obtained by coating prepared compositions a to h on a substrate having a groove and a fin on a surface, heating and drying at 150° C. for 1 minute, and then baking at 250° C. for 2 minutes in the air. The film thickness of obtained underlayers was 300 nm. The groove had a width of 200 nm and a depth of 90 nm, and the fin had a width of 40 nm in used substrate. The cross section of the obtained underlayers was observed by electron scanning microscope S-5500 (trade name, Hitachi High-Technologies Corporation), void generating was evaluated.

The results of the evaluation were shown in table 3. The evaluation criteria of void generating are shown below.

(Evaluation Criteria of Void Generating)

A: When the cross section was observed by electron scanning microscope, no void was found.

B: When the cross section was observed by electron scanning microscope, voids were found.

TABLE 3

|  | Composition | Void generation |
|---|---|---|
| Example 201 | a | A |
| Example 202 | b | A |
| Example 203 | c | A |
| Example 204 | d | A |
| Comparative Example 201 | e | B |
| Comparative Example 202 | f | B |
| Comparative Example 203 | g | B |
| Comparative Example 204 | h | B |

Examples 301 to 302 and Comparative Examples 301 to 304

Underlayers were obtained by coating prepared compositions a to h and baking. The film thickness of obtained underlayer was 100 nm. The solvent resistance of the obtained underlayers was evaluated. Specifically, PGMEA, PGME and methoxytoluene were prepared as a solvent, the obtained underlayers were dipped in each for 1 minute. Then, film thickness of the underlayers before and after dipping was measured by Lambda Ace VM-3110 optical interference type film thickness measuring apparatus and calculated residual ratio of film. The results of the evaluation are shown in table 4.

TABLE 4

|  | Composition | Residual Film Ratio (%) | | |
|---|---|---|---|---|
|  |  | PGMEA | PGME | methoxytoluene |
| Example 301 | b | 100 | 100 | 100 |
| Example 302 | d | 95 | 95 | 90 |
| Comparative Example 301 | e | 0 | 0 | 0 |
| Comparative Example 302 | f | 0 | 0 | 0 |
| Comparative Example 303 | g | 100 | 100 | 90 |
| Comparative Example 304 | h | 100 | 100 | 90 |

Examples 401 and Comparative Examples 401 to 404

Underlayers were obtained by coating prepared compositions B and E to H, on substrates having a groove and a fin on a surface, heating and drying at 150° C. for 1 minute, and then baking at 250° C. for 2 minutes in the air. The groove had a width of 200 nm and a depth of 90 nm, and the fin had a width of 40 nm in used substrate. The obtained underlayers were observed by electron scanning microscope S-5500, and each difference in height on the surface was evaluated. The results of the evaluation are shown in table 5.

TABLE 5

|  | Composition | Difference in height (nm) |
|---|---|---|
| Example 301 | B | 82 |
| Comparative Example 301 | E | 94 |
| Comparative Example 302 | F | 91 |
| Comparative Example 303 | G | 88 |
| Comparative Example 304 | H | 89 |

Examples 501 to 506

Underlayers were obtained by coating prepared compositions B on substrates having grooves of 40 nm width and 90 nm depth, on surfaces, heating and drying at 150° C. for 1 minute, and then baking. The baking conditions were changed as shown in table 6. The obtained underlayers were observed by electron scanning microscope S-5500, and each difference in height on the surface was evaluated. The results of the evaluation are shown in table 6. Those results clearly show that the higher baking temperature leads the smaller difference in height.

TABLE 6

|  | Baking conditions | Difference in height (nm) |
|---|---|---|
| Example 501 | 150° C./2 minutes in the air | 74 |
| Example 502 | 250° C./2 minutes in the air | 82 |
| Example 503 | 300° C./2 minutes in the air | 49 |
| Example 504 | 350° C./2 minutes in the air | 45 |
| Example 505 | 400° C./2 minutes in the air | 41 |
| Example 506 | 450° C./2 minutes in the air | 35 |

Examples 601 to 605

Underlayers were obtained by coating prepared compositions B on substrates having grooves of 40 nm width and 90 nm depth, on surfaces to achieve 300 nm film thickness, heating and drying at 150° C. for 1 minute, and then baking. The baking conditions were changed as shown in table 7. The obtained underlayers were observed by electron scanning microscope S-5500, and each difference in height on the surface was evaluated. The results of the evaluation are shown in table 7.

TABLE 7

|  | Baking conditions | Difference in height (nm) |
|---|---|---|
| Example 601 | 250° C./2 minutes in the air | 45 |
| Example 602 | 300° C./2 minutes in the air | 32 |
| Example 603 | 350° C./2 minutes in the air | 30 |
| Example 604 | 400° C./2 minutes in the air | 28 |
| Example 605 | 450° C./2 minutes in the air | 25 |

Examples 701 to 705 and Comparative Examples 701

Underlayers were obtained by coating prepared compositions B on substrates having grooves of 40 nm width and 90 nm depth, on surfaces to achieve 300 nm film thickness, heating and drying at 150° C. for 1 minute, then pre-baking in the nitrogen atmosphere for 60 minutes, and baking further in the air at 350° C. for 1 minute. The pre-baking conditions were changed as shown in table 8. For comparison, an underlayer was obtained by carrying out as in above except for changing pre-baking temperature to 350° C., using composition F. The obtained underlayers were observed by electron scanning microscope S-5500, and each difference in height on the surface was evaluated. The results of the evaluation are shown in table 8.

TABLE 8

| | Baking conditions | Difference in height (nm) |
|---|---|---|
| Example 701 | 250° C./60 minutes in a nitrogen atmosphere | 20 |
| Example 702 | 300° C./60 minutes in a nitrogen atmosphere | 9 |
| Example 703 | 350° C./60 minutes in a nitrogen atmosphere | 4 |
| Example 704 | 400° C./60 minutes in a nitrogen atmosphere | 4 |
| Example 705 | 450° C./60 minutes in a nitrogen atmosphere | 3 |
| Comparative Example 701 | 350° C./60 minutes in a nitrogen atmosphere | 36 |

Examples 801 to 802 and Comparative Examples 801

Underlayers were obtained by coating and baking as in the same conditions of Example 1, using compositions B, D and F. The obtained underlayers were etched, and the change of before and after ethching film thicknesses (residual film ratio) was measured. The etching was carried out at a condition of RF power 200 W (ISM)/100 W (BIAS), gas flow $O_2/Ar/N_2$, 4/25/10 sccm, pressure 0.67 Pa by etching apparatus NE-5000N type (trade name, ULVAC, Inc.). The results of the evaluation are shown in table 9.

TABLE 9

| | Composition | Before Etching Film Thickness (nm) | Affter Etching Film Thickness (nm) | Residual Film Ratio |
|---|---|---|---|---|
| Example 801 | B | 97 | 42 | 4 |
| Example 802 | D | 94 | 39 | 41 |
| Comparative Example 801 | F | 98 | 16 | 16 |

Examples 901 to 905 and Comparative Examples 901

Pre-baked layers were obtained by coating prepared compositions b on substrates on surfaces to achieve 200 nm film thickness, heating and drying at 150° C. for 1 minute, then pre-baking in the nitrogen atmosphere at 350° C. for 2 minutes. The solvent solubility of the obtained pre-baked layers was evaluated. Specifically, some mixed solvents of PGMEA and methoxytoluene, which had various mixing ratio, were prepared and the obtained pre-baked layers were dipped in each for 1 minute. Then, the film thickness after dipping was measured by Lambda Ace VM-3110 optical interference type film thickness measuring apparatus and calculated residual film ratio. For comparison, an underlayer was obtained using a composition U98 and then solvent solubility of the obtained underlayer was evaluated as in above. Here, this composition U98 comprises a polymer PR, which is represented from the following formula and different from the polymers of present invention, a cross-linking agent, thermal acid generator and a solvent.

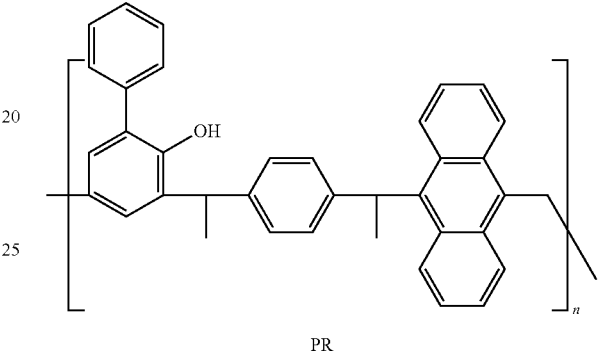

PR

When the composition for forming an underlayer of the present invention is used, residual film ratio can be controlled by bringing the pre-baked layer into contact with the solvent. Accordingly, the film thickness can be reduced by the solvent etched back.

TABLE 10

| | PGMEA/methoxytoluene Mixing Ratio | After Etching Film Thickness (nm) | Residual Film Ratio (%) |
|---|---|---|---|
| Example 901 | 100/0 | 200 | 100 |
| Example 902 | 70/30 | 186 | 93 |
| Example 903 | 5050 | 134 | 67 |
| Example 904 | 30/70 | 54 | 27 |
| Example 905 | 0/100 | 0 | 0 |
| Comparative Example 901 | 0/100 | 200 | 100 |

Examples 1001 to 1002 and Comparative Examples 1001 to 1002

Pre-baked layers were obtained by coating prepared compositions b to achieve 100 nm film thickness, heating and drying at 150° C. for 1 minute, then pre-baking in the nitrogen atmosphere for 2 minutes. Here, the temperature of the pre-baking was changed with respect to each example. The solvent solubility of the obtained pre-baked layer was evaluated. Specifically, PGMEA or methoxytoluene was prepared and the obtained pre-baked layers were dipped for 1 minute. Then, the film thickness after dipping was measured by Lambda Ace VM-3110 optical interference type film thickness measuring apparatus and calculated residual film ratio. For comparison, an underlayer was obtained using a composition U98 and then solvent solubility of the obtained underlayer was evaluated as in above. The results of the evaluation are shown in table 11.

TABLE 11

| | Composition | pre-baking temperature (° C.) | Residual Film Ratio (%) PGMEA dipping | Residual Film Ratio (%) methoxytoluene dipping |
|---|---|---|---|---|
| Example 1001 | b | 300 | 0 | — |
| Example 1002 | b | 350 | 98 | 0 |
| Example 1002 | b | 450 | — | 0 |
| Comparative Example 1002 | U98 | 300 | 100 | — |
| Comparative Example 1001 | U98 | 350 | 100 | 100 |
| Comparative Example 1002 | U98 | 450 | — | 100 |

The invention claimed is:

1. A method for forming an underlayer, comprising:
a coating step, wherein a coating layer is formed by coating a substrate with a composition for forming an underlayer comprising:
a polymer having a repeating unit selected from the following formulae (1) to (4):

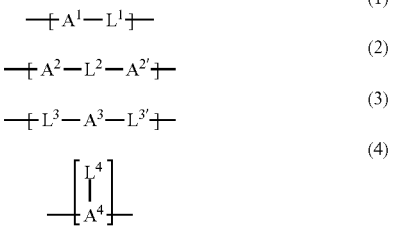

wherein
A1, A2 and A2' are independently selected from the group consisting of phenylene group and naphthylene group,
A3 and A4 are independently an aromatic group, or a saturated or unsaturated aliphatic hydrocarbon group,
where said aromatic group or aliphatic hydrocarbon group may be substituted by a substituent selected from the group consisting of hydroxy group, alkyl group, aryl group, alkoxy group, nitro group, amide group, dialkylamino group, sulfonamide group, imide group, carboxy group, sulfonic acid ester group, alkylamino group and arylamino group,
L1, L2, L3 and L3' are independently selected from the following formulae (a1) to (a3):

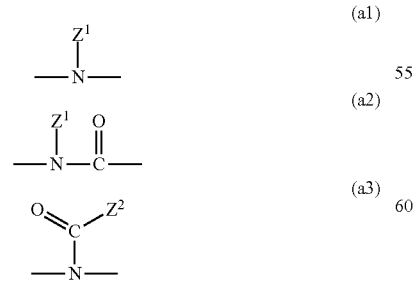

wherein
Z1 is selected from the group consisting of hydrogen, phenyl group and naphthyl group,
Z2 is selected from the group consisting of hydrogen, hydroxy group, alkyl group, aryl group, alkoxy group, nitro group, amide group, dialkylamino group, sulfonamide group, imide group, carboxy group, sulfonic acid ester group, alkylamino group and arylamino group,
L4 is selected from the group consisting of amino group and carbamoyl group, and substituted aromatic group and substituted aliphatic group having the amino group and carbamoyl group as substituent, and
a solvent, and wherein the content ratio of said polymer is 0.2 to 20 mass % based on the total weigh mass of said composition,
a pre-baking step in an inert gas atmosphere, and a baking step, wherein an underlayer is formed by baking said coating layer in the existence of oxygen,
and a surface layer removing step between said coating step and said baking step, wherein said coating layer is brought into contact with a solvent capable of solubilizing said polymer and the surface layer of the coating layer is dissolved and removed.

2. The method according to claim 1, wherein heating temperature at said baking step is 200 to 800° C. and baking time is 0.3 to 120 minutes.

3. The method according to claim 1, wherein the content ratio of oxygen in said inert gas atmosphere is 3 mol % or less.

4. The method according to claim 1, wherein said $A^4$ is selected from the group consisting of saturated hydrocarbon group of 1 to 6 carbon atoms and unsaturated hydrocarbon group of 2 to 6 carbon atoms, and said $L^4$ is selected from the group consisting of substituted or unsubstituted amino group, and substituted or unsubstituted carbamoyl group.

5. The method according to claim 1, wherein said $A^3$ is selected from the group consisting of saturated hydrocarbon group of 1 to 12 carbons and unsaturated hydrocarbon group of 2 to 12 carbons.

6. The method according to claim 1, wherein said polymer has a mass-average molecular weight of 1,000 to 1,000,000.

7. A pattern formation method, comprising:
a coating step, wherein a coating layer is formed by coating a substrate with a composition for forming an underlayer comprising:
a polymer having a repeating unit selected from the following formulae (1) to (4):

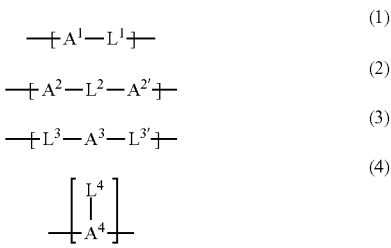

wherein
A1, A2 and A2' are independently selected from the group consisting of phenylene group and naphthylene group,
A3 and A4 are independently an aromatic group, or a saturated or unsaturated aliphatic hydrocarbon group,
where said aromatic group or aliphatic hydrocarbon group may be substituted by a substituent selected from the group consisting of hydroxy group, alkyl group, aryl group, alkoxy group, nitro group, amide group, dialkylamino group, sulfonamide group, imide group, carboxy group, sulfonic acid ester group, alkylamino group and arylamino group, L1, L2, L3 and L3' are independently selected from the following formulae (a1) to (a3):

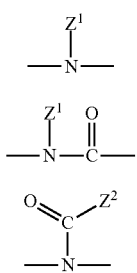

wherein

Z1 is selected from the group consisting of hydrogen, phenyl group and naphthyl group, Z2 is selected from the group consisting of hydrogen, hydroxy group, alkyl group, aryl group, alkoxy group, nitro group, amide group, dialkylamino group, sulfonamide group, imide group, carboxy group, sulfonic acid ester group, alkylamino group and arylamino group, L4 is selected from the group consisting of amino group and carbamoyl group, and substituted aromatic group and substituted aliphatic group having the amino group and carbamoyl group as substituent, and a solvent, and wherein the content ratio of said polymer is 0.2 to 20 mass % based on the total weigh mass of said composition, a baking step, wherein an underlayer is formed by baking said coating layer in the existence of oxygen, a resist layer forming step, wherein a photoresist layer is formed on said underlayer, an exposure step, wherein said substrate coated with said underlayer and said photoresist layer is exposed, and a developing step, wherein the exposed substrate is developed with a developing solution.

8. The method according to claim 7, wherein said $A^4$ is selected from the group consisting of saturated hydrocarbon group of 1 to 6 carbon atoms and unsaturated hydrocarbon group of 2 to 6 carbon atoms, and said $L^4$ is selected from the group consisting of substituted or unsubstituted amino group, and substituted or unsubstituted carbamoyl group.

9. The method according to claim 7, wherein said $A^3$ is selected from the group consisting of saturated hydrocarbon group of 1 to 12 carbons and unsaturated hydrocarbon group of 2 to 12 carbons.

10. The method according to claim 7, wherein said polymer has a mass-average molecular weight of 1,000 to 1,000,000.

11. The method according to claim 7, wherein said exposure is achieved by the ArF laser.

12. The method according to claim 7, wherein said substrate has a groove with the width of 1 to 1,000 nm and the depth of 20 to 1,000 nm on the surface.

13. The method according to claim 7, wherein heating temperature at said baking step is 200 to 800° C. and baking time is 0.3 to 120 minutes.

14. The method according to claim 7, wherein the method comprises a pre-baking step in an inert gas atmosphere, and the content ratio of oxygen in said inert gas atmosphere is 3 mol % or less.

* * * * *